March 8, 1966 F. J. MOLLO 3,239,777

NON-SATURATING BLOCKING OSCILLATOR

Filed April 17, 1964

INVENTOR
F. J. MOLLO
BY R. B. Ardis
ATTORNEY

United States Patent Office 3,239,777
Patented Mar. 8, 1966

3,239,777

NON-SATURATING BLOCKING OSCILLATOR

Frank J. Mollo, Somerville, N.J., assignor to Bell Telephone Laboratories, Incorporated, New York, N.Y., a corporation of New York Filed Apr. 17, 1964, Ser. No. 360,684
5 Claims. (Cl. 331—112)

This invention relates to a blocking oscillator circuit with saturation prevention features and, more particularly, to voltage step-up blocking oscillator circuits with closed loop regulation.

In transistor blocking oscillator circuits, as well as in other transistor switching circuits, it is usually desired to prevent saturation of the switching transistor. Saturation prevention is desired since a switching transistor driven into saturation has an excess of charge carriers in one of its semiconductor zones which must be dissipated before the transistor can be biased into cutoff. The time required to dissipate the excess charge carriers increases the switching time of the transistor, which in turn results in physically larger filtering components and transient protection requirements.

Blocking oscillator circuits with switching transistor saturation prevention features are found quite frequently in the prior art. These circuits, however, usually require a large number of additional components or, alternatively, precision components which are critically biased. In either case, the additional or precision components are expensive and, for this reason, usually not incorporated into switching circuitry where saturation prevention features would otherwise be desired as, for example, in regulator circuits wherein only small load variations are expected.

A blocking oscillator transistor is frequently used as the switching element in direct voltage step-up circuits, i.e., circuits wherein the switch, during alternate intervals, first connects an inductor across the source and then disconnects, leaving the inductor and source serially connected with the load to deliver a load voltage higher than the source voltage. Load voltage regulation is usually introduced into these voltage step-up circuits by complex and critically biased transistor networks which vary the switching intervals (duty cycle) of the blocking oscillator transistor in accordance with load voltage variations. These networks increase the cost of the circuit and tend to reduce reliability to the point where the regulated circuit is undesirable for most applications and notably for applications wherein only small load variations are expected.

The object of this invention is, therefore, to eliminate the need for either a large number of components or precision components in a regulated high-speed voltage step-up circuit wherein a blocking oscillator transistor, which is prevented from going into saturation, is used as the switching element.

In accordance with one feature of the invention, an extra winding, which is serially connected with a zener diode across the load, is added to the blocking oscillator transformer. At a load voltage controlled point in the blocking oscillator transistor conduction cycle, the zener diode breaks down to permit current flow through the additional winding. The current flow in the additional winding opposes the inherent regenerative process of the blocking oscillator, which is driving the transistor toward saturation, and thereby both prevents transistor saturation and, due to the load voltage control of the zener diode breakdown, introduces regulation.

Other objects and features of the present invention will become apparent upon consideration of the following detailed description when taken in connection with the accompanying drawing, in which.

Figure 1:
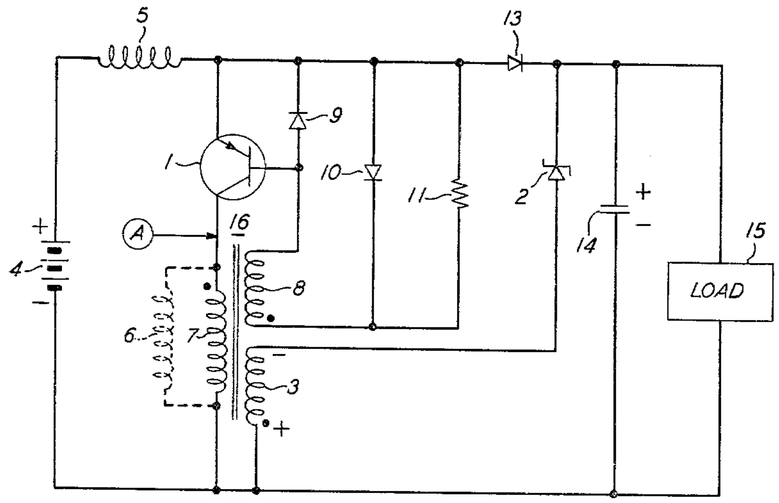
FIG. 1 is a schematic diagram of an embodiment of the invention.

In the embodiment of the invention illustrated in FIG. 1, the emitter-collector path of blocking oscillator p-n-p transistor 1 is serially connected with the primary winding 7 of transformer 16, the direct-current input source 4, and the inductor 5. Winding 8 of transformer 16 is serially connected with the resistor 11 and the base-emitter path of transistor 1. Diode 9, which is poled to conduct in a direction opposite to the base-emitter current flow of transistor 1, is connected across the base-emitter path of transistor 1. Diode 10 is connected across resistor 11. Blocking diode 13 serially connects the load 15 with the input direct-current source 4 and the inductor 5. Zener diode 2 and extra winding 3 of transformer 16 are serially connected across the load 15. Filter capacitor 14 is also connected across the load 15.

The operation of the circuit can best be understood by assuming that small base-emitter and collector-emitter currents are flowing through transistor 1. The collector-emitter current flow in transistor 1 may be traced from the positive terminal of the direct-current input source 4, through the inductor 5, the emitter-collector path of transistor 1, and the winding 7 of transformer 16, back to the negative terminal of the direct-current source 4. The current flow through winding 7 in turn induces a voltage in windings 3 and 8, the relative polarities of the induced voltages being indicated by the dots associated with each of the windings. The potential induced in winding 8 is applied to the base-emitter path of transistor 1 via current limiting and waveform shaping resistor 11 to bias transistor 1 further into conduction, thus causing more collector-emitter current flow and, in turn, higher base-emitter bias and so on toward transistor saturation in typical regenerative fashion. The zener diode 2, winding 3 network stops the regenerative process before transistor 1 goes into saturation, as discussed in detail hereinafter. For present purposes it appears sufficient to note that once the regenerative process is terminated, the flux in transformer 16 collapses and thereby induces a potential in winding 8 of a polarity opposite to the previously induced potential to bias transistor 1 into cutoff. Transistor 1 remains cut off until the energy stored in transformer 16 is dissipated, as discussed in detail hereinafter. Once the flux is dissipated, transistor 1 is once again regeneratively biased into conduction and the process regeneratively repeats itself.

The collector-emitter current through transistor 1 also flows through inductor 5 and, characteristically, causes energy to be stored in this inductor. The polarity of the potential across inductor 5 is, with respect to the energy stored in filter capacitor 14 from previous cycles of oscillation of transistor 1, such as to back-bias blocking diode 13 so that no energy is supplied to the load during the conductive interval of transistor 1.

Although the energy stored in, and hence the potential across, capacitor 14 exponentially discharges through the load 15, the potential induced in winding 3 decreases at a faster rate, i.e., the terminal of the winding connected to the anode of zener diode 2 becomes less positive. The magnitude of the positive potential appearing between the cathode and anode electrodes of zener diode 2 therefore increases as the regenerative process continues.

At a time in the conductive interval of transistor 1 prior to the time at which transistor 1 would, if allowed to proceed unimpeded, go into saturation, the potential difference across zener diode 2 is such that zener breakdown occurs, thereby causing current flow from the positive terminal of capacitor 14, through zener diode 2 in the inverse direction (cathode-to-anode), and through serially connected winding 3 in a direction opposite to the direction of the induced current flow, back to capacitor 14. This current flow in turn induces a potential in windings 7 and 8 of transformer 16 that opposes the induced regenerative potentials to retard the regenerative process of transistor 1 (i.e., as discussed hereinafter, "sets back" the regenerative process to a point early in the conduction interval of transistor 1 from which the regenerative process again begins to build up) and thereby prevents transistor 1 from going into saturation. As discussed hereinafter, except for large load voltage variations, the other circuit parameters then determine the conductive interval of transistor 1.

Figure 2:
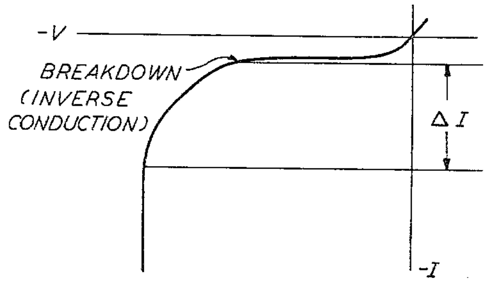
FIG. 2 illustrates the characteristics of the zener diode used in FIG. 1.

FIG. 2 of the drawing illustrates the reverse zener characteristic of a p-n junction diode, such as diode 2 in FIG. 1. As can be seen from the characteristic shown in the drawing, current through the diode in the inverse direction increases from a small leakage value in a nonlinear manner once the breakdown voltage of the diode is exceeded. As the current through the diode continues to increase from the breakdown value over the range $\Delta I$ indicated on FIG. 2, the impedance of the zener diode 2 decreases proportionately until the zener diode becomes saturated in the inverse direction. Once the zener diode is saturated in the inverse direction, it will thereafter have a constant voltage drop across it which is independent of the current flow through it.

If the load voltage or the voltage appearing across capacitor 14 in the foregoing discussion were to suddenly become very large, it is readily seen that zener diode 2 would be quickly biased into the constant voltage region with the current flowing in winding 3 being sufficient to cause a voltage to be induced in winding 8 so as to drive transistor 1 into cutoff. Overvoltage protection is thus incidentally provided. For normal conditions, however, only relatively small variations in the load 15 will occur and the parameters of circuit will be chosen so that zener diode 2 will normally function in the $\Delta I$ region as a variable impedance.

Since zener diode 2 acts as a variable impedance in the $\Delta I$ region and is responsive to the voltage appearing across capacitor 14 and load 15, the action of zener diode 2 and winding 3 introduces voltage regulation to the circuit, i.e., the point of zener breakdown in the regenerative cycle of transistor 1 and the current control impedance exhibited by the diode are determined by the voltage across the load 15. Since the current flow through winding 3 opposes the regenerative process of transistor 1, the extent of the opposition and the subsequent magnitude of current flow through the collector-emitter path of transistor 1 will be determined by the magnitude of the load voltage. Regulation is thus introduced over a limited range in two respects: first, the point at which the zener diode 2, winding 3 network comes into play is determined by the load voltage and, secondly, the impedance of the diode is also controlled by the load voltage once the zener diode 2, winding 3 network is activated. The manner in which the load voltage responds to this regulation will be discussed in detail hereinafter.

As noted, once zener diode 2 conducts in the inverse direction, the current flow through winding 3 introduces a flux, which is proportional to the load voltage, into the core of transformer 16. The flux thus introduced opposes the normal or regenerative flux set up by the current flow through winding 7 and reduces the base drive induced in winding 8. This opposing flux has the effect of returning the transistor 1 to a point earlier in the regenerative cycle but does not, except in the case of an overvoltage discussed earlier, have the effect of cutting off transistor 1. Transistor 1 then resumes the regenerative process and again proceeds toward transistor saturation.

The duration of the conductive interval of transistor 1 is determined by the effective inductance of winding 7, which may be treated as an equivalent external inductance shunt across the transformer winding. This effective inductance is represented in the drawing as a dotted inductor 6 shunted across winding 7. Initially, this inductance appears as an open circuit to the flow of current appearing at point A and all the current flows through winding 7, which now may be treated as an ideal winding with no inductance, but with the reflected impedance of the circuit of winding 8 effectively connected in series therewith. As time goes on, however, more and more current flows through the equivalent external inductance 6 and less through the winding 7 until finally substantially all the current is flowing through equivalent inductance 6. At this point the flux stored in the transformer collapses and induces a potential of a polarity opposite to the original polarity in all the windings, thereby driving transistor 1 into cutoff. Semiconductor diode 9, which by its forward conducting threshold limits the inverse voltage appearing across the base-emitter path of transistor 1, and semiconductor diode 10 are now biased into conduction to dissipate the energy stored in transformer 16 during the conductive interval of transistor 1. Once this energy is dissipated, transistor 1 is once again biased into conduction.

Once the current flow through the emitter-collector path of transistor 1 ceases, the energy stored in inductor 5 induces a voltage across it, the polarity of which is such as to sustain a current flow through the inductor in the same direction as the original current flow. The energy stored in inductor 5 therefore induces a voltage across inductor 5 of a polarity opposite to the original polarity. This induced voltage, in combination with the voltage of the source 4, is greater than the voltage appearing across the load 15. Blocking diode 13 is, therefore, biased into conduction. The sum of the voltages from inductor 5 and source 4 is thus transmitted to the load 15 to charge filter capacitor 14. It should be noted that the voltage delivered to the load is greater than that of the source 4 and voltage step-up is thus achieved. This transfer of energy occurs rather quickly and only a relatively small interval of time is required. Once capacitor 14 is charged to a voltage greater than the sum of the voltages appearing across the source 4 and inductor 5, diode 13 is again back-biased.

As noted heretofore, the retarding action of the winding 3, zener diode 2 network reduces the collector-emitter current flow in transistor 1. The energy stored in inductor 5 is, however, directly proportional to the current flow therethrough which is, of course, also the current flow through the emitter-collector path of transistor 1. It follows, therefore, that if the load voltage is high the retarding action occurs earlier in the regenerative conduction interval and thereby decreases the average conduction interval current flow through the emitter-collector path of transistor 1. The reduction of the average current flow through the emitter-collector path of transistor 1 in turn causes less energy to be stored in the inductor 5 to compensate for the high load voltage. If the load voltage is low, on the other hand, retardation occurs later in the conduction interval, the average current increases, and more energy is stored in inductor 5 to compensate for the low load voltage.

In summary, saturation prevention and regulation are added to the blocking oscillator switching circuit by the addition to the blocking oscillator transformer of an extra winding 3 which is serially connected with a zener diode 2 across the load. The zener diode breaks down at a point in the conduction cycle prior to saturation of the blocking oscillator transistor to prevent saturation of the transistor. Regulation is achieved by the composite effect of the load voltage on the point in time at which zener diode breakdown is achieved, and on the variable impedance characteristic of the zener diode.

The above-described arrangement is illustrative of the application of the principles of the invention. Other embodiments may be devised by those skilled in the art without departing from the spirit and scope of the invention.

What is claimed is:

1. A non-saturable oscillator comprising a transistor having base, collector, and emitter electrodes, a transformer having primary, feedback, and control windings, a source of input potential, means serially connecting said source of input potential, the emitter-collector path of said transistor, and said primary winding, means connecting said feedback winding to the base-emitter path of said transistor to regeneratively switch said transistor between alternate conductive and nonconductive states, a load, means connecting said load to said source when said transistor is in the nonconductive state, and voltage responsive means connecting said control winding across said load when the voltage difference between said load and said control winding reaches a predetermined magnitude, whereby said transistor is prevented from going into saturation.

2. A non-saturable oscillator in accordance with claim 1 wherein said voltage responsive means is a zener diode.

3. A regulator comprising a transistor having base, collector, and emitter electrodes, a transformer having primary, feedback, and contol windings, a source of input potential, an inductor, means serially connecting said source of input potential, said inductor, the emitter-collecor path of said transistor, and said primary winding, means connecting said feedback winding to the base-emitter path of said transistor to regeneratively switch said transistor between alternate conductive and nonconductive states, a load, a blocking diode poled to transmit load current only when said transistor is in the non-conductive state, means serially connecting said blocking diode with said load, said source of potential, and said inductor, and voltage responsive means connecting said control winding across said load when the voltage difference between said load and said control winding reaches a predetermined magnitude, whereby said transistor is prevented from going into saturation and voltage regulation is provided.

4. A regulator in accordance with claim 3 wherein said voltage responsive means is a zener diode which when initially biased into the zener region exhibits a variable impedance to inverse conduction over a fixed current range.

5. A voltage boost switching regulator comprising a transistor having base, collector, and emitter electrodes, a transformer having primary, feedback, and control windings, a source of input potential, an inductor, means serially connecting said source of input potential, said inductor, the emitter-collector path of said transistor, and said primary winding, means connecting said feedback winding to the base-emitter path of said transistor to regeneratively switch said transistor between alternate conductive and non-conductive states, a load, a blocking diode poled to transmit load current from said source and said inductor to said load only when said transistor is in the non-conductive state, means serially connecting said blocking diode with said load, said source of potential, and said inductor, a filter capacitor, means connecting said filter capacitor across said load to supply energy to said load when said transistor is in the non-conductive state, a zener diode, and means serially connecting said zener diode and said control winding across said capacitor, whereby said zener diode will conduct in the inverse direction during the conductive interval of said transistor when the voltage difference between said capacitor and said control winding reaches a predetermined magnitude.

No references cited.

NATHAN KAUFMAN, *Acting Primary Examiner.*

J. KOMINSKI, *Examiner.*